(12) United States Patent
Bray

(10) Patent No.: US 7,731,075 B2
(45) Date of Patent: Jun. 8, 2010

(54) WELDING OF SINGLE CRYSTAL ALLOYS

(75) Inventor: Simon E. Bray, Derby (GB)

(73) Assignee: Rolls-Royce plc, London (GB)

( * ) Notice: Subject to any disclaimer, the term of this patent is extended or adjusted under 35 U.S.C. 154(b) by 65 days.

(21) Appl. No.: 12/227,432

(22) PCT Filed: May 15, 2007

(86) PCT No.: PCT/GB2007/001782

§ 371 (c)(1),
(2), (4) Date: Nov. 18, 2008

(87) PCT Pub. No.: WO2007/144557

PCT Pub. Date: Dec. 21, 2007

(65) Prior Publication Data

US 2009/0173769 A1    Jul. 9, 2009

(30) Foreign Application Priority Data

Jun. 16, 2006   (GB) ................. 0611926.7

(51) Int. Cl.
*B23K 20/12* (2006.01)
(52) U.S. Cl. ............. 228/112.1; 228/234.1; 228/262.3
(58) Field of Classification Search .............. None
See application file for complete search history.

(56) References Cited

U.S. PATENT DOCUMENTS

| | | | |
|---|---|---|---|
| 3,788,890 A | 1/1974 | Mader et al. | |
| 3,951,729 A * | 4/1976 | Takagi et al. | 117/35 |
| 4,643,782 A | 2/1987 | Harris et al. | |
| 5,366,695 A | 11/1994 | Erickson | |
| 2005/0050705 A1 * | 3/2005 | Segletes et al. | 29/402.13 |
| 2008/0305560 A1 * | 12/2008 | Henrichs | 438/4 |
| 2009/0031822 A1 * | 2/2009 | Ohta et al. | 73/862.338 |
| 2009/0162948 A1 * | 6/2009 | Henrichs | 438/3 |
| 2009/0269193 A1 * | 10/2009 | Larose et al. | 415/200 |
| 2009/0304514 A1 * | 12/2009 | Izadi et al. | 416/213 R |

FOREIGN PATENT DOCUMENTS

| | | |
|---|---|---|
| DE | 103 61 882 A1 | 7/2005 |
| JP | A-2-258182 | 10/1990 |
| SU | 1237352 A1 | 6/1986 |

* cited by examiner

*Primary Examiner*—Kiley Stoner
(74) *Attorney, Agent, or Firm*—Oliff & Berridge, PLC

(57) ABSTRACT

A blade member is oscillated in the direction of arrow A-A relative to a rim of a disc; a forge force is applied radially and a weld is formed along line; the blade member is formed from a face centred cubic (FCC) nickel based single crystal alloy, such as CMSX-4 of Cannon-Muskegon Corporation; the orientation of the single crystal blade member is controlled to maximize the stress on the slip plane; by maximizing the stress on the slip plane the in-plane friction forces and the forge force are minimized; minimizing the in-plane forces enables the single crystal blade member to be successfully welded to the rim of the disc.

10 Claims, 4 Drawing Sheets

Nominal <001> direction

Nominal <001> direction

WELDING OF SINGLE CRYSTAL ALLOYS

The present invention relates to the welding of single crystal alloys and in particular to a method of linear friction welding single crystal alloys.

Single crystal alloys are used in the manufacture of a wide range of components used in gas turbine engines. To extend cyclic life, hot components such as turbine blades and nozzle guide vanes are cast from single crystal alloys so that they do not contain any grain boundaries.

Increasing there is a requirement to conduct high integrity welding of these single crystal alloys. For example an aerofoil blisk comprises a plurality of blades welded onto the outer periphery of the disc or onto posts extending from the rim of the disc. It is known to join the blades to the disc by friction welding. In this process a blade member (which will subsequently be machined to form the finished blade) is oscillated relative to a stationary disc whilst a load is applied in a radial direction towards the disc. Initially the joint faces are brought into contact with a moderate forge load and heat is generated by friction due to the relative motion between the joint faces. The heat softens the material at the joint interface and plastic flow causes material to be extruded as flash from the edges of the joint. In the final phase relative motion ceases and a bond is created by the continued application of the same forging load or by increasing the forging load.

The advantage of the friction welding process is that intimate contact is maintained and any contaminants at the joint interface are expelled as the flash is extruded. The cycle takes seconds to complete and the integrity of this process lends itself to use on critical parts such as blisks.

Difficulties have been encountered however when trying to frictionally weld turbine blades manufactured from single crystal alloys onto a disc. The anisotropic properties of single crystal alloys results in differing resistance to the plastic flow. The resistance to the plastic flow depends on the direction of loading. When applied to the linear friction welding process, these variations in resistance to plastic flow result in different weld behaviour for different orientations of the single crystal with respect to the weld oscillation and the forge load.

For particular crystal orientations the required force for a successful weld can be excessive and may result in the failure of the welding machine and/or the tooling, if not designed to accommodate these excessive loads.

The present invention seeks to overcome the aforementioned problems by establishing crystal orientations, which minimise the in-plane forces and enable the successful welding of single crystal alloys by allowing plastic flow. Plastic flow is required to extrude the flash and produce a sound joint, free of surface contaminants.

According to the present invention a method of friction welding a first single crystal component to a second component comprises the steps of oscillating the components relative to one another whilst applying a forging force characterised in that the single crystal component is orientated so that a primary slip plane is aligned to a plane containing both the direction of oscillation and the direction in which the forge force is applied and a primary slip direction within the slip plane is controlled within a angular range about the oscillation direction.

Preferably the primary slip plane in a face centred cubic (FCC) crystal lattice system is the (111) plane and the primary slip direction is the <110> direction.

In the preferred embodiment of the present invention the first component is formed from a FCC nickel based single crystal alloy such as, but not exclusively, CMSX-4 of Cannon-Muskegon Corporation. The first component may be a blade member or a post, which is friction welded to a disc for use in a gas turbine engine.

In the preferred embodiment of the present invention the primary <110> slip direction is controlled within an angular range of the order of 0°-11° about the oscillation direction.

The present invention will now be described with reference to the accompanying figures in which.

Referring to FIG. 1 a blade member 10 is oscillated in the direction of arrow A-A relative to a rim post 12 on a disc 14. A forge force is applied radially and a weld is formed along line 16.

The blade member 10 is formed from a face centred cubic (FCC) nickel based single crystal alloy, such as CMSX-4 of Cannon-Muskegon Corporation. The single crystal blade member 10 essentially consists of a single unidirectional grain.

Figure 1A:
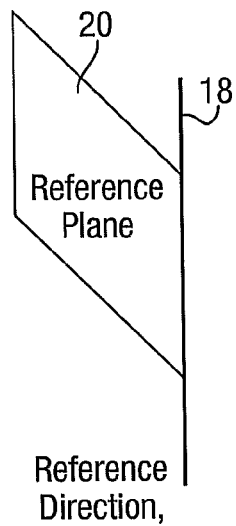
FIGS. 1a and 1b are pictorial views showing the preferred orientation of a single crystal blade member relative to the welding oscillation direction when welding to a disc.
Figure 1A:
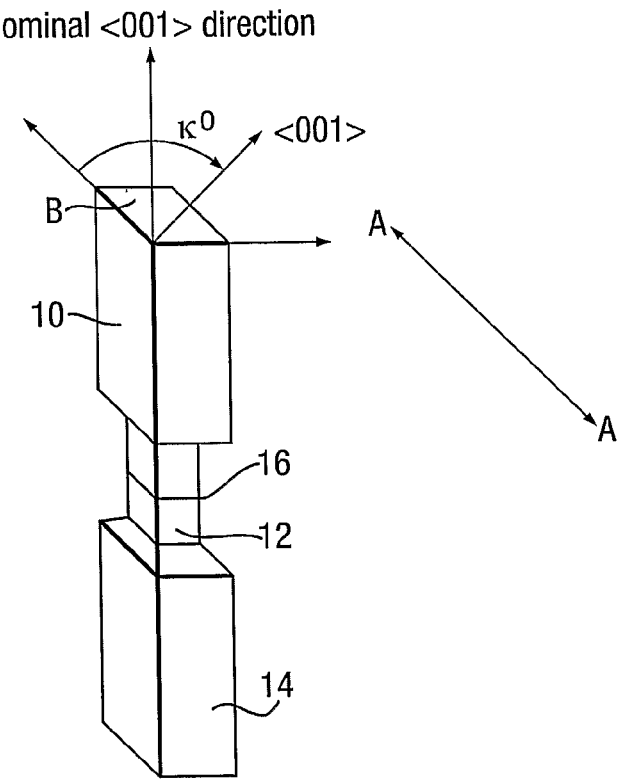
Figure 1B:
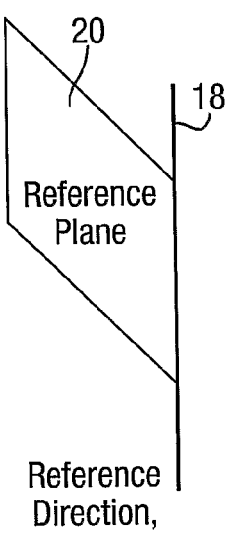
Figure 1B:
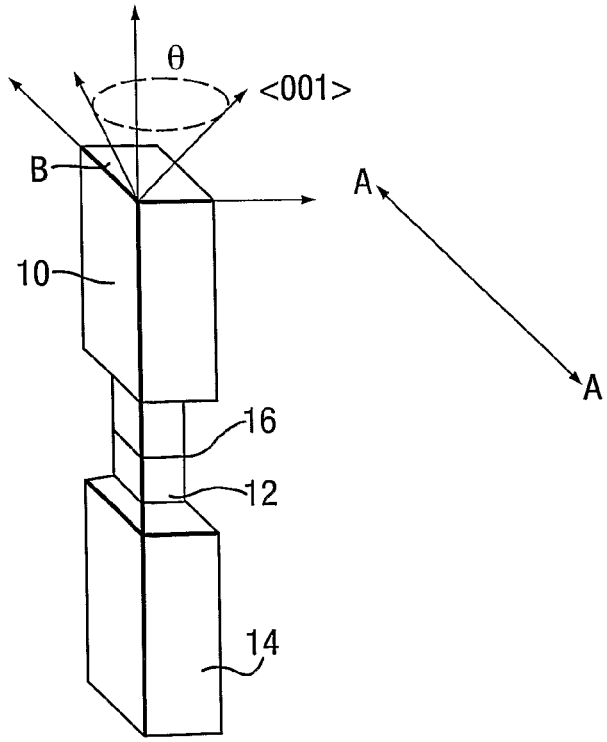
Figure 2:
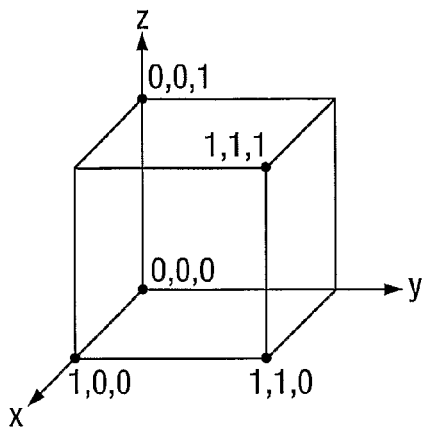
FIG. 2 shows the co-ordinate points in a face centred cubic (FCC) unit cell, which is a subdivision of a lattice representing a single crystal.

FIG. 2 shows a unit cell of a face centred cubic (FCC) lattice of a single crystal. Positions within the unit cell can be located by the coordinate system shown in FIG. 2. Distance is measured in terms of lattice parameters, the coordinates of which are written as three distances x, y and z. A group of equivalent crystallographic directions are indicated by special brackets "< >" and a group of equivalent crystallographic planes are indicated by special brackets "{ }". In a cubic system a direction is perpendicular to a plane with the same coordinates.

Figure 3:
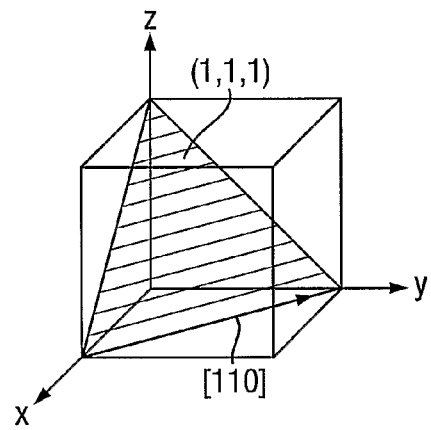
FIG. 3 shows the (111) slip plane and the <110> slip direction of the FCC unit cell shown in FIG. 2.

FIG. 3 indicates the (111) slip plane and the [110] slip direction within the FCC unit cell. For the friction welding of single crystal components, such as the blade member 10, the orientation of the single crystal should be controlled to maximise the stress on the slip plane (111). By maximising the stress on the (111) slip plane the in-plane friction forces and the forge force are minimised. Minimising the in-plane forces enables the single crystal blade member 10 to be successfully welded to the rim 12 of the disc 14.

Figure 4:
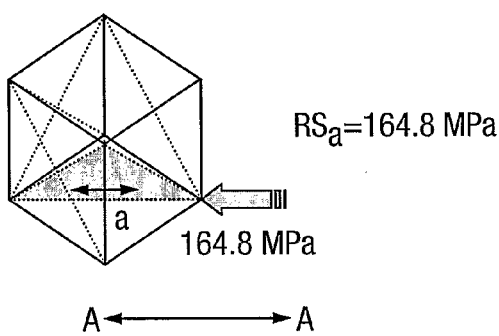
FIG. 4 shows the friction load when resolved onto the <110> slip direction of a FCC unit cell when aligned with the oscillation direction.

To minimise the in-plane forces the single crystal blade member 10 is orientated so that the forge load and the friction load are applied to the (111) slip plane and the direction of oscillation is applied in the <110> slip direction. FIG. 4 shows the friction force when resolved into the <110> slip direction.

Figure 5:
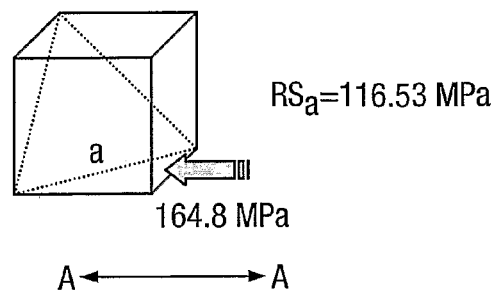
FIG. 5 shows the friction load when resolved onto the <110> slip direction of a FCC unit cell when not aligned with the oscillation direction.

FIG. 5 indicates the reduction in the resolved stresses $RS_a$ when the friction loads are not applied directly in or on the (111) slip plane.

The orientation of the active slip system, the {111} slip plane and the <110> slip direction, of the single crystal blade member 10 must also be aligned within a controlled angular range relative to the weld plane and the direction of oscillation A-A.

The orientation relationship between the crystal direction <001> and the specified axes of a component is termed the primary orientation. The specified axes of a component are a reference direction and a reference plane, which contains the reference direction. For the blade member 10, FIG. 1, the reference direction 18 is radial and the reference plane 20 contains the reference direction 18 and the oscillation direction A-A.

The primary orientation measurement is in the form of six characteristic angles gamma ν, delta δ, kappa κ, theta θ, alpha α and rho ρ, which relate to the specified axes of the component. The primary orientation of the crystal with respect to the weld oscillation direction A-A must be defined to avoid excessive frictional forces. Angles alpha α, kappa κ and theta θ are important in controlling the resultant in plane friction forces.

When linear friction welding the single crystal blade member 10 to the rim post 12 on the disc 14 angles theta and kappa are controlled. Using English convention, angle kappa is defined as the clockwise rotation about the <001> direction nearest to the reference direction, measured from the reference plane to the nearest <001> direction when viewing the examined face B in FIG. 1a. The <001> direction nearest to the reference direction may not be parallel to the later. The angle theta θ, is defined as the deviation, regardless of direction, from the reference direction to the nearest <001> direction.

Figure 6:
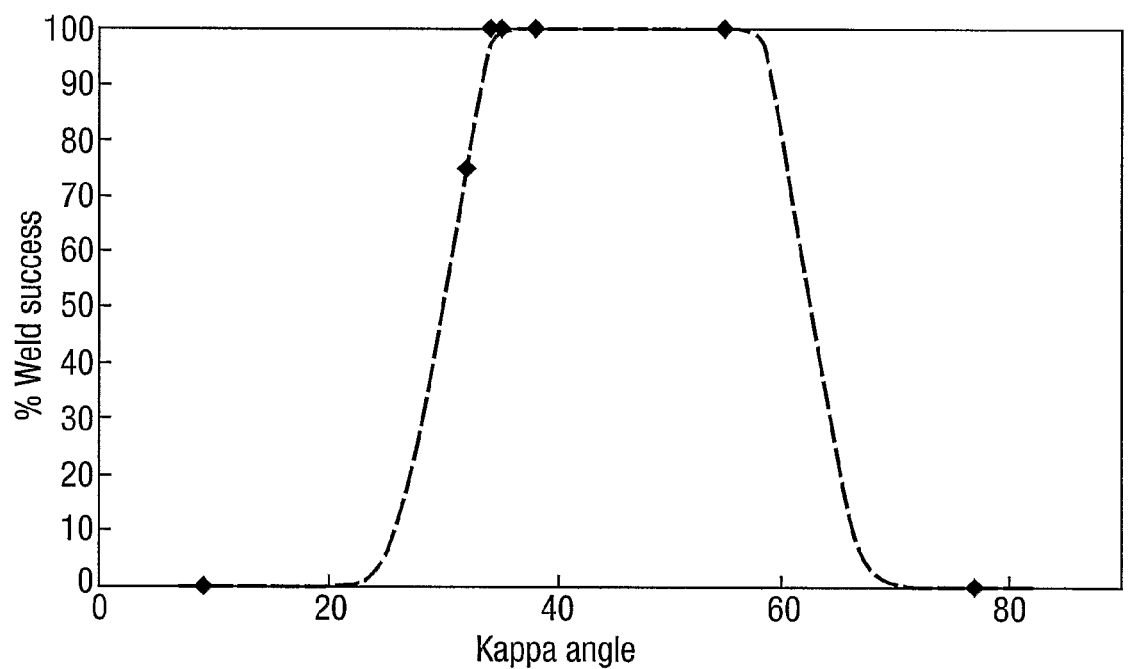
FIG. 6 is a plot showing the optimum crystal orientation angle kappa verses weld success.

To form a successful weld between the turbine blade member 10 and the rim post 12 on the disc 14, the angle theta θ is kept at less than or equal to 20° and angle kappa κ must be kept within an angular range of the order of 34° to 56°. If kappa is kept within this angular range of 34° to 56° the weld is always successful, FIG. 6.

Figure 7:
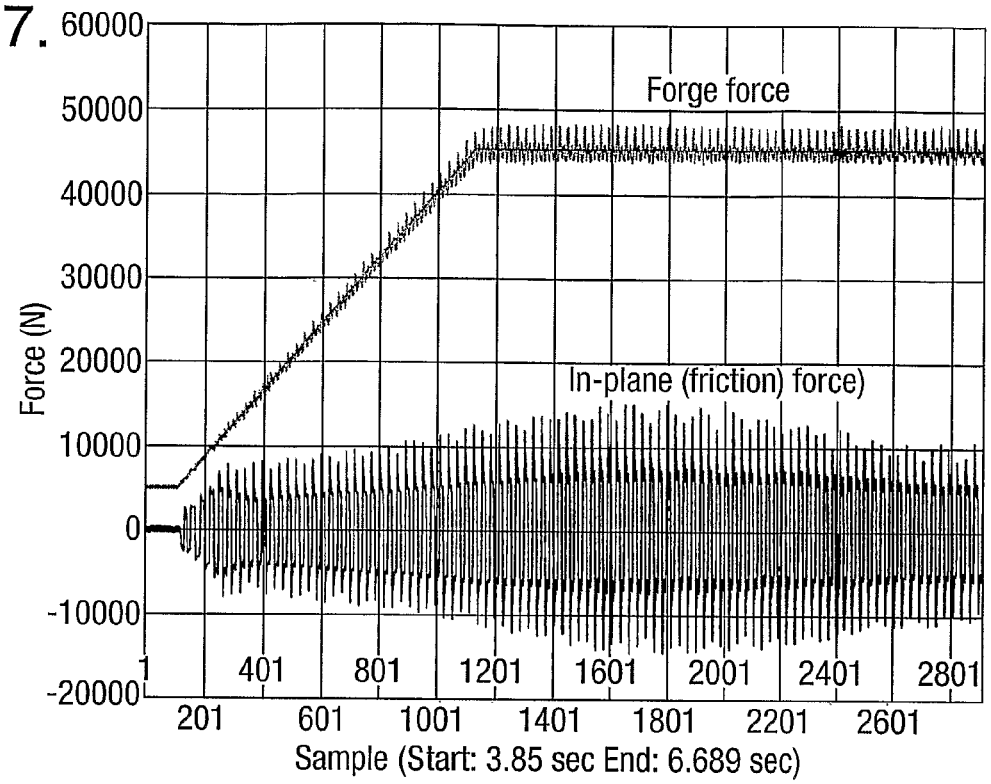
FIG. 7 shows the characteristics of the forces in a successful weld.

FIG. 7 shows the characteristics of a successful weld with low in-plane forces, which are stable.

Figure 8:
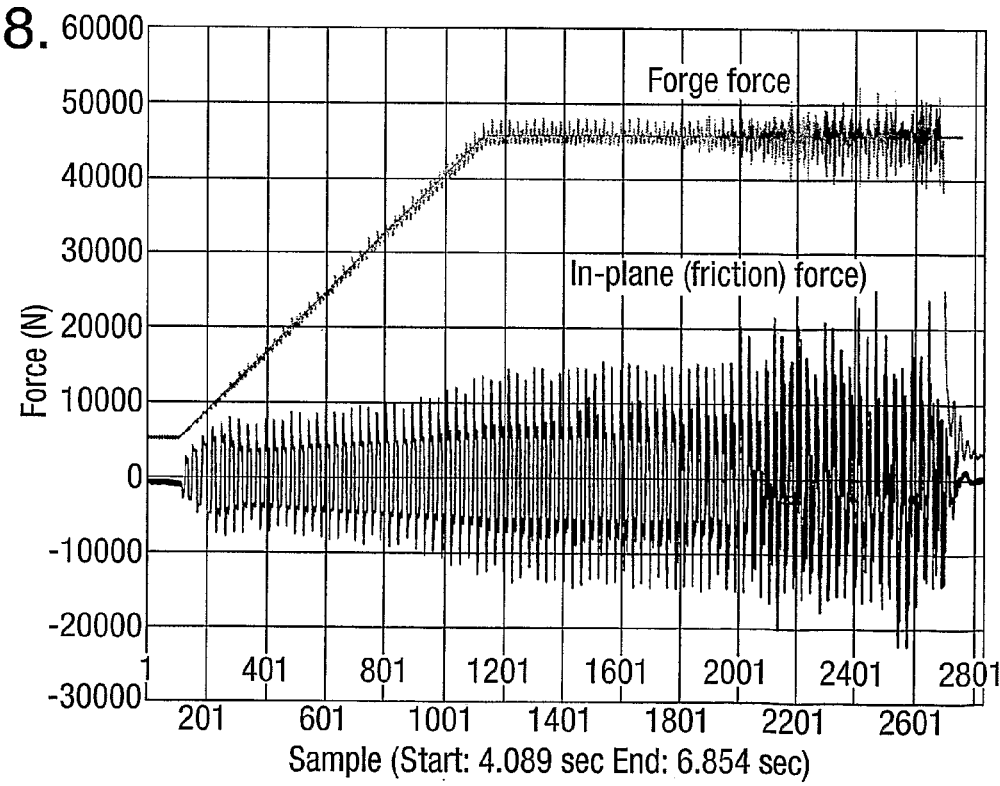
FIG. 8 shows the characteristics of the forces in an unsuccessful weld.

FIG. 8 shows an unsuccessful weld with larger, erratic in-plane forces.

To successfully friction weld a single crystal component the slip plane must be aligned to a plane containing the forge and the friction forces whilst also controlling the <110> direction nearest to the oscillation direction within an angular range of the order of 0°-11° about the oscillation direction.

If the orientation of the single crystal component is controlled in this way the in-plane forces are reduced and a successful weld will be achieved.

Whilst the present invention has been described with reference to the friction welding of a single crystal blade member onto a disc it will be appreciated that it is applicable to the friction welding of any single crystal component.

The invention claimed is:

1. A method of friction welding a first single crystal component to a second component comprising the steps of oscillating the components relative to one another whilst applying a forging force wherein the single crystal component is orientated so that a primary slip plane is aligned to a plane containing both the direction of oscillation and the direction in which the forge force is applied and a primary slip direction is controlled within an angular range about the oscillation direction.

2. A method of friction welding as claimed in claim 1 wherein the first component is a cubic lattice crystal and the primary slip plane is the plane and the primary slip direction is the direction.

3. A method of friction welding as claimed in claim 2 wherein the primary slip direction is controlled within an angular range of the order of 0°-11° about the oscillation direction.

4. A method of friction welding as claimed in claim 2 wherein the first component is formed from a nickel based single crystal alloy.

5. A method of friction welding as claimed in claim 1 in which the first component is a blade member or a post and the second component is a disc.

6. A method of friction welding as claimed in claim 3 wherein the first component is formed from a nickel based single crystal alloy.

7. A method of friction welding as claimed in claim 2 in which the first component is a blade member or a post and the second component is a disc.

8. A method of friction welding as claimed in claim 3 in which the first component is a blade member or a post and the second component is a disc.

9. A method of friction welding as claimed in claim 4 in which the first component is a blade member or a post and the second component is a disc.

10. A method of friction welding as claimed in claim 6 in which the first component is a blade member or a post and the second component is a disc.

* * * * *